United States Patent [19]

Lavi

[11] Patent Number: 4,697,241
[45] Date of Patent: Sep. 29, 1987

[54] HARDWARE LOGIC SIMULATOR

[75] Inventor: Yoav Lavi, Raanana, Israel

[73] Assignee: Simulog, Inc., Santa Clara, Calif.

[21] Appl. No.: 707,040

[22] Filed: Mar. 1, 1985

[51] Int. Cl.[4] .................. G06F 15/20; G06F 15/60; H03K 19/088

[52] U.S. Cl. .................. 364/488; 307/465; 364/716; 364/900

[58] Field of Search .............. 364/488, 489, 490, 716, 364/200 MS File, 900 MS File, 800, 801, 802, 578; 307/465, 468, 469, 243, 466, 467; 434/118; 371/23

[56] References Cited

U.S. PATENT DOCUMENTS

| | | | |
|---|---|---|---|
| 3,291,974 | 12/1966 | Even | 307/465 |
| 3,446,990 | 5/1969 | Goldberg | 307/465 |
| 3,700,868 | 10/1972 | Silvertson, Jr. | 307/465 |
| 3,728,534 | 4/1983 | Bertram et al. | 434/118 |
| 3,912,914 | 10/1975 | Moylan | 307/465 |
| 4,207,556 | 6/1980 | Sugiyama et al. | 364/716 |
| 4,217,658 | 8/1980 | Henry et al. | 364/900 |
| 4,488,354 | 12/1984 | Chan et al. | 364/490 |
| 4,551,814 | 11/1985 | Moore et al. | 364/716 |
| 4,551,815 | 11/1985 | Moore et al. | 364/716 |
| 4,558,236 | 12/1985 | Bunous | 307/469 |
| 4,580,215 | 4/1986 | Morton | 364/716 |

OTHER PUBLICATIONS

Yau et al., "Universal Logic Circuits and Their Modular Relizations," *Spring Joint Computer Conference,* 1968, pp. 297-305.

Pp. 127-138 of *Electronic Design* of Nov. 10, 1983.

Papers 7.1, 7.2 and 7.3 presented at the 19th Design Automation Conference of the IEEE in 1982.

*Primary Examiner*—Felix D. Gruber
*Assistant Examiner*—Daniel W. Juffernbruch
*Attorney, Agent, or Firm*—Sandler & Greenblum

[57] ABSTRACT

Apparatus for verifying the design of a logic circuit composed of a plurality of interconnected logic elements comprises a plurality of hardware gates, each of which is programmable so as to correspond to and emulate an element in said logic circuit. Each hardware gate has an output and at least two inputs. A selectively operable interconnection system is provided for establishing a connection between the output of any hardware gate and an input of any hardware gate. A multiplexing system is also provided for operating the interconnection system and determining which, and when, each connection is made between the output of any hardware gate and an input of any hardware gate.

39 Claims, 11 Drawing Figures

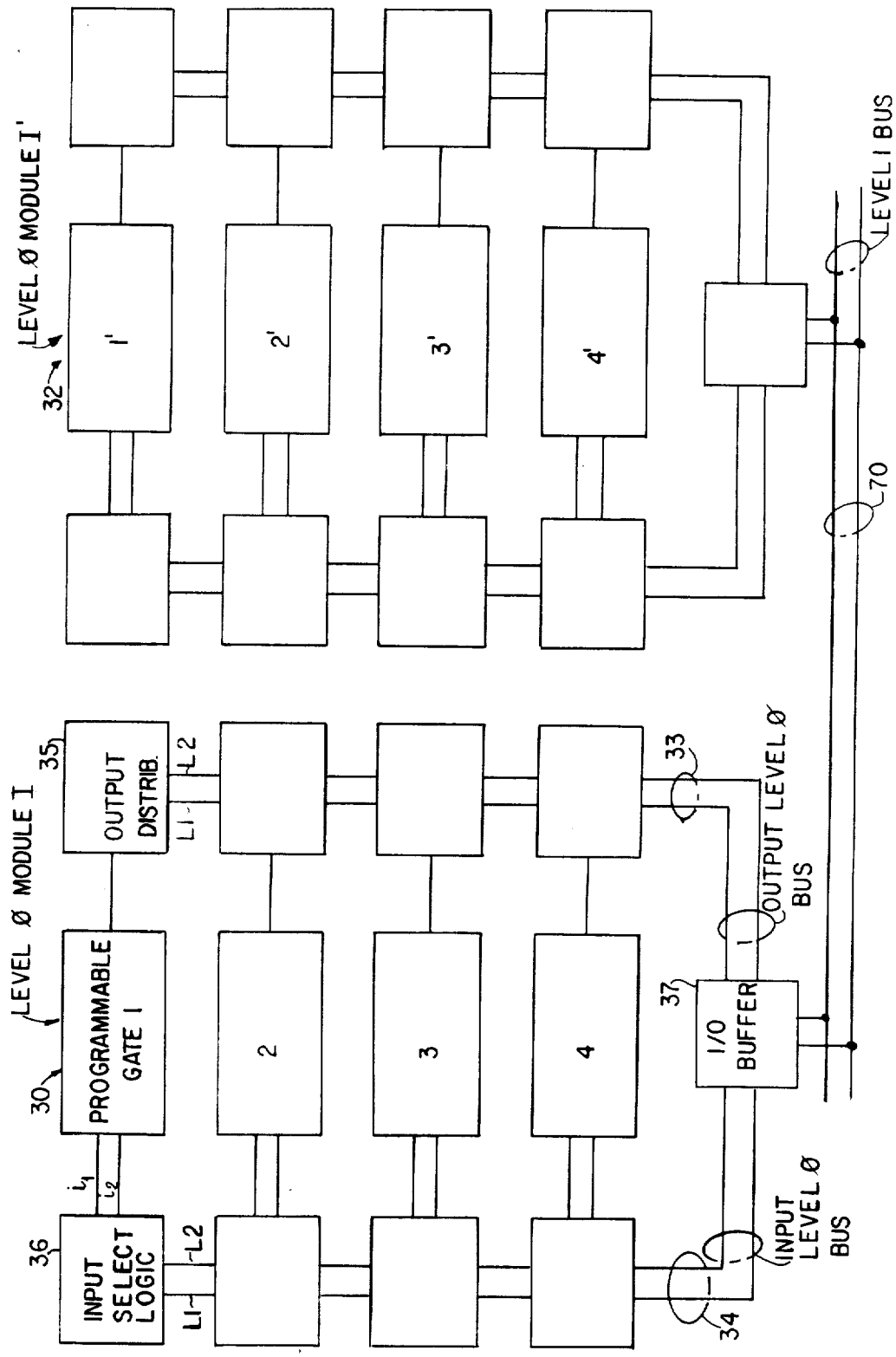

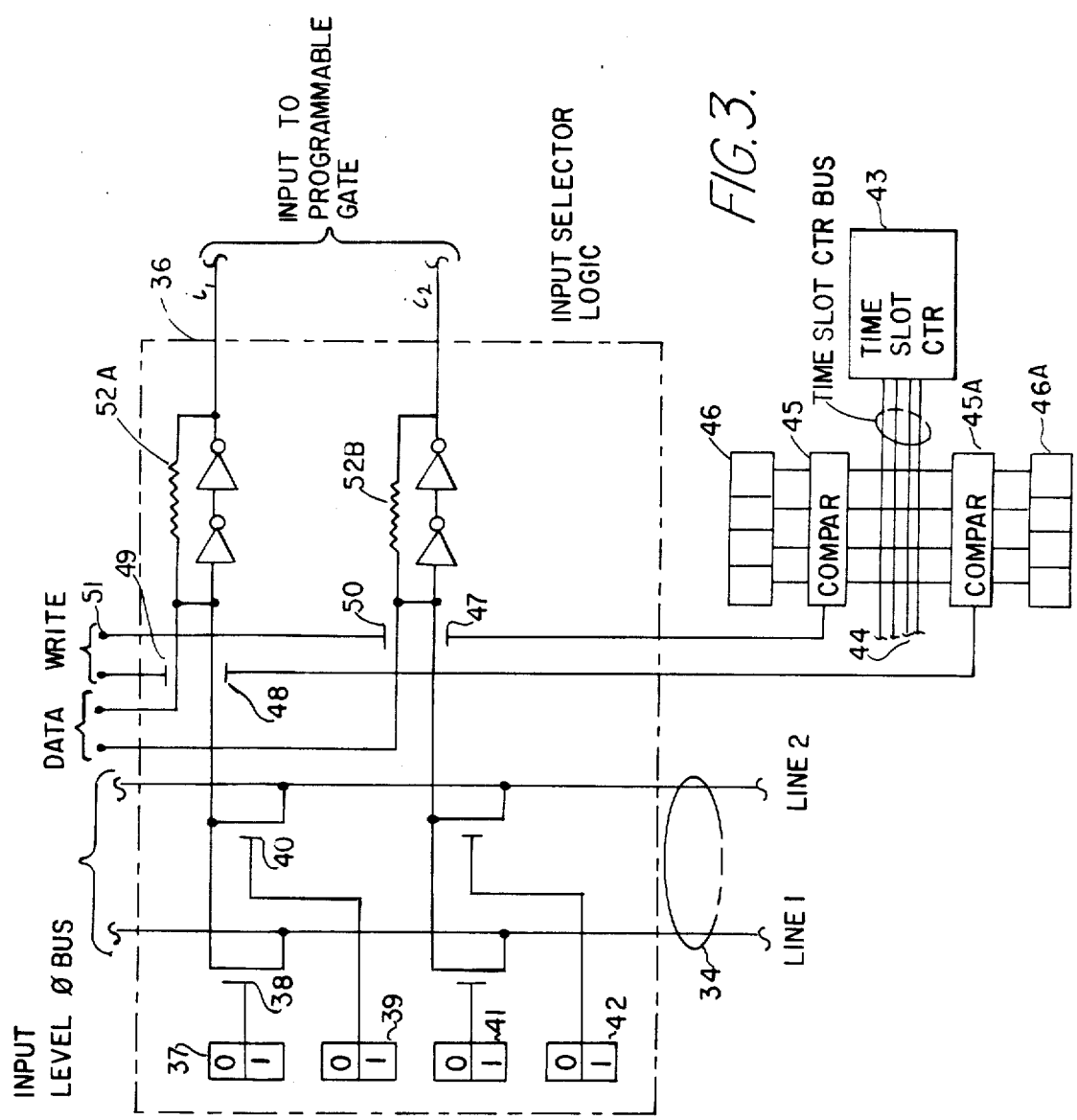

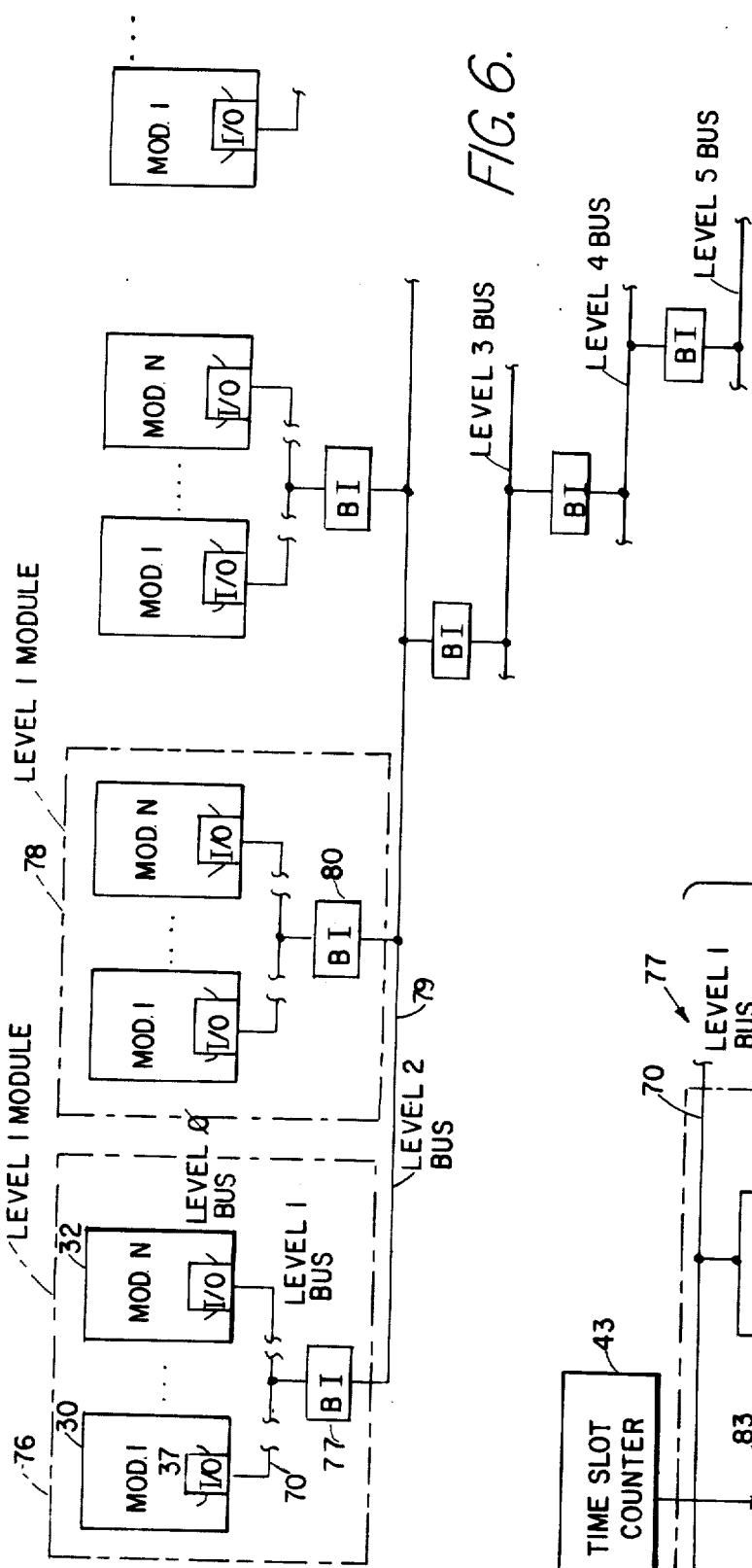
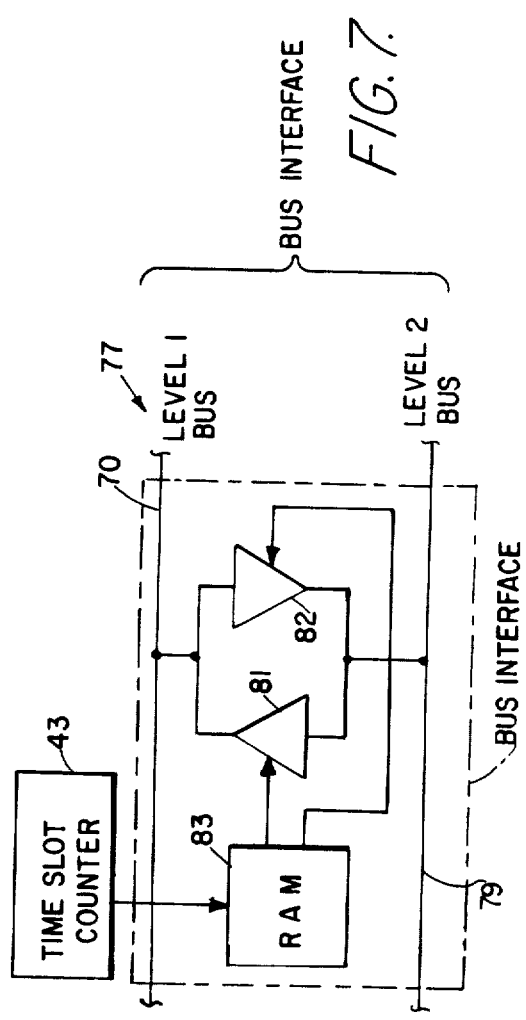

| SC | ABC | T | BL1 | BL2 |
|----|-----|---|-----|-----|
| 1 | 000 | X | 1/0 | 0/1 |
| 2 | 000 | X | 1/0 | 0/X |
| 3 | 000 | 0 | 1/0 | 0/0←OUTPUT SAMPLED |
| 4 | 001 | X | 1/X | 1/X |
| 5 | 001 | X | 1/1 | 1/X |
| 6 | 001 | 1 | 1/1 | 1/1←OUTPUT SAMPLED |
| 7 | 010 | X | | |
| 8 | 010 | | | |
| 9 | 010 | | | |
| 10 | 011 | | | |
| 11 | 1 | | | |
| 12 | 1 | | | |
| 13 | | | | |
| 14 | | | | |
| 15 | | | | |
| 16 | | | | |
| 17 | | | | |
| 18 | | | | |
| 19 | | | | |
| 20 | | | | |
| 21 | | | | |
| 22 | | | | |
| 23 | | | | |
| 24 | | | | |

FIG. 8A.

HARDWARE LOGIC SIMULATOR

TECHNICAL FIELD

This invention relates to hardware logic simulators for verifying the design of a logic circuit by applying all possible inputs to a simulation of the logic circuit, and determining its corresponding outputs.

BACKGROUND OF THE INVENTION

The more complex electronic circuitry becomes, the more important is the ability to verify, before hardware is constructed, that a given circuit design will perform as intended. To this end, software logic simulators, in the form of special purpose computers, have been used to simulate logic circuits and thus permit evaluation of a design without having to construct and test actual circuits. Recently, hardware logic simulators have been developed to more quickly verify the design of logic circuits.

Known hardware logic simulators are based on optimizing either a single CPU or multiple CPU's, to run logic simulation software. An example of a single CPU logic simulator is the "Megalogician" produced by Daisy Systems Corporation, and described in pages 127–138 of *Electronic Design*, Nov. 10, 1983. This device employs a special purpose CPU designed to execute logic simulation in a fast pipelined manner.

A logic simulator based on multiple CPU's is the Yorktown Simulation Engine (YSE) produced by IBM, and described in papers 7.1, 7.2, and 7.3 presented at the 19th Design Automation Conference of the IEEE in 1982. The YSE is a very complicated machine composed of 256 special purpose CPU's interconnected by a complex switching network. Each of the CPU's is designed to execute logic simulation of a part of a simulated network concurrently with the execution of logic simulation of other parts of the network by other CPU's.

The main problem with known logic simulators is their speed in terms of gate-evaluations per second. If a logic simulator is capable of 100,000 gate-evaluations per second, such simulator could evaluate a logic circuit with 10,000 gates in about 1,000 seconds. However, a larger circuit with 100,000 gates would require about 10 days to complete the evaluation.

When the logic circuit is based on one CPU, at least one CPU instruction is required for each gate-evaluation limiting the speed, using present, computers to about $10^7$ to $10^8$ gate-evaluations per second. Even when several CPU's are used, as in the YSE, the communication system for effecting the transfer of data between the various processors, becomes very complicated, cumbersome, and expensive. The YSE appears to be the fastest simulator at the present time, and it can carry out no more than $2 \times 10^9$ gate-evaluations per second. While this speed is impressive, the size and complexity of logic circuitry continues to increase, and with such increase comes the need for logic simulators capable of even more gate-evaluations per second.

It is therefore an object of the present invention to provide a new and improved logic simulator whose design philosophy is such that it is inherently capable of greater gate-evaluation per second than logic simulators presently known.

BRIEF DESCRIPTION OF THE INVENTION

Apparatus according to the present invention for verifying the design of a logic circuit composed of a plurality of interconnected logic elements comprises a plurality of hardware gates, each of which corresponds to and emulates a logic element in said logic circuit. Each hardware gate has an output and at least two inputs; and selectively operable interconnection means are provided for establishing a connection between the output of any hardware gate and an input to any hardware gate. Finally, multiplex means are provided for operating said interconnection means and determining which, and when, each connection is made.

Each hardware gate is programmable to emulate a logic element in a logic circuit to be verified and comprises a plurality of logic gates interconnected by switches whose settings configure the hardware gate to emulate a logic element in said logic circuit. Preferably, each hardware gate comprises an AND gate, an OR gate, an invertor, and electronic switches for effecting interconnections between the various gates.

The multiplex means establishes the input to and output of the apparatus, and is constructed and arranged to establish temporally limited connections between the hardware gates according to a schedule upon the completion of which the apparatus will have produced outputs corresponding to the outputs of said logic circuit for each possible input thereto.

The output of each hardware gate is assigned a bus pin and a time slot. For example, if there are 16 bus lines and 10,000 time slots, then 160,000 different bus line-time slot combinations can be assigned to 160,000 hardware gates. The time slot number and bus line designation is programmable into the hardware gate.

According to the present invention, the multiplex means causes the bus line to be sampled in a time slot according to the output to which it is connected. Thus, the output of a hardware gate may be designated as TxDy, where x is the time slot during which this output drives or is connected to its bus line y. In addition, each input to a hardware gate is designated by TxDy, where x is the time slot in which this input samples bus line y. A simulation cycle is completed when all gate outputs have been transmitted and received by the appropriate inputs. Thus, simulation speed is inversely proportional to the number of time slots.

Further in accordance with the present invention, a plurality of level 0 modules is provided, each of which comprises a plurality of hardware gates having inputs and outputs, and individually corresponding to and emulating different logic elements. In addition, a level 0 output bus is provided having a plurality of output bus lines that correspond to a plurality of input bus lines of a level 0 input bus. An output distributor is provided for each hardware gate for establishing connections between the outputs of the hardware gates and the output bus lines of the level 0 output bus. In addition, an input selector is provided in association with each of the hardware gates for establishing connections between the inputs to the hardware gates and the input bus lines of the level 0 input bus. Finally, an input/output (I/O) buffer is also provided for selectively connecting output bus lines of the level 0 output bus to corresponding input bus lines of the level 0 input bus.

With this arrangement, a level 1 bus is provided for interconnecting the I/O buffers of pairs of level 0 modules. A bus interface is also provided connected to each level 1 bus, and a level 2 bus is provided for interconnecting pairs of bus interfaces. Using this hierarchy, all signals within level 0 modules are transmitted in parallel on level 0 buses. When signals are to be transferred between different level 0 blocks that belong to the same level 1 bus, then the bus interface of the level 0 blocks control the transfer through the level 1 bus. The bus interface directs the output signal in the appropriate time slot to drive the level 1 bus. The other bus interface accepts the signal from the level 1 bus in the same time slot and will drive the level 0 bus of the other block providing the input to the desired hardware gate in the other block. This parallelism continues to the uppermost bus level.

The above described hierarchy takes advantage of the locality nature of electronic systems which are composed of a plurality of sub-systems interconnected into a larger system. Actually, only a minority of the signals generated connect different sub-systems. The result is that the processing of the majority of the signals in the modules is done concurrently, and only a small percentage of processing require the transfer of data between various modules.

For example, the preferred embodiment would have five hierarchy levels: four sub-systems, each composed of 16 printed circuit boards, each board being composed of 8 integrated circuit groups, each integrated circuit group being composed of 16 integrated circuits, and each integrated circuit being composed of 128 programmable hardware gates. Sixteen bus lines are required for all of the hierarchy levels. Assuming 95% of the processing occurs in a local level for all levels, and time slots of $10^{-7}$ seconds, eight time slots are required for internal integrated circuit communication, 6.4 time slots are required for integrated circuit communication within the same group, 2.56 time slots are required for integrated circuit communication on the same board, 2.048 time slots are required for interboard communication on the same subsystem, and 0.409 time slots are required for intersubsystem communication. Thus, one simulation cycle requires 19.417 time slots which can be achieved in two microseconds. Because the entire system has 1,048,576 gates, the system operates at $0.5 \times 10^{12}$ gate-evaluations per second which is considerably higher than the fastest known logic simulator.

BRIEF DESCRIPTION OF THE DRAWINGS

An embodiment of the present invention is shown in the accompanying drawings wherein:

FIG. 2 is a schematic block diagram of two, level 0 modules according to the present invention interconnected by a level 1 bus;

FIG. 3 is a schematic block diagram of an input selector for selectively connecting the inputs of a programmable gate in a level 0 module to individual bus lines of a level 0 input busline;

FIG. 6 is a schematic block diagram of apparatus in accordance with the present invention showing two hierarchal levels, and specifically showing level 0 buses, for interconnecting programmable gates within level 0 modules, level 1 buses are for interconnecting two level 0 modules, and a level 2 bus for interconnecting level 1 modules;

FIG. 7 is a schematic block diagram of a bus interface for interconnecting two level 1 modules via a level 2 bus;

FIG. 8A is a truth table chart representing the inputs and outputs of the simple logic circuit of FIG. 8.

DETAILED DESCRIPTION OF THE INVENTION

Figure 1:
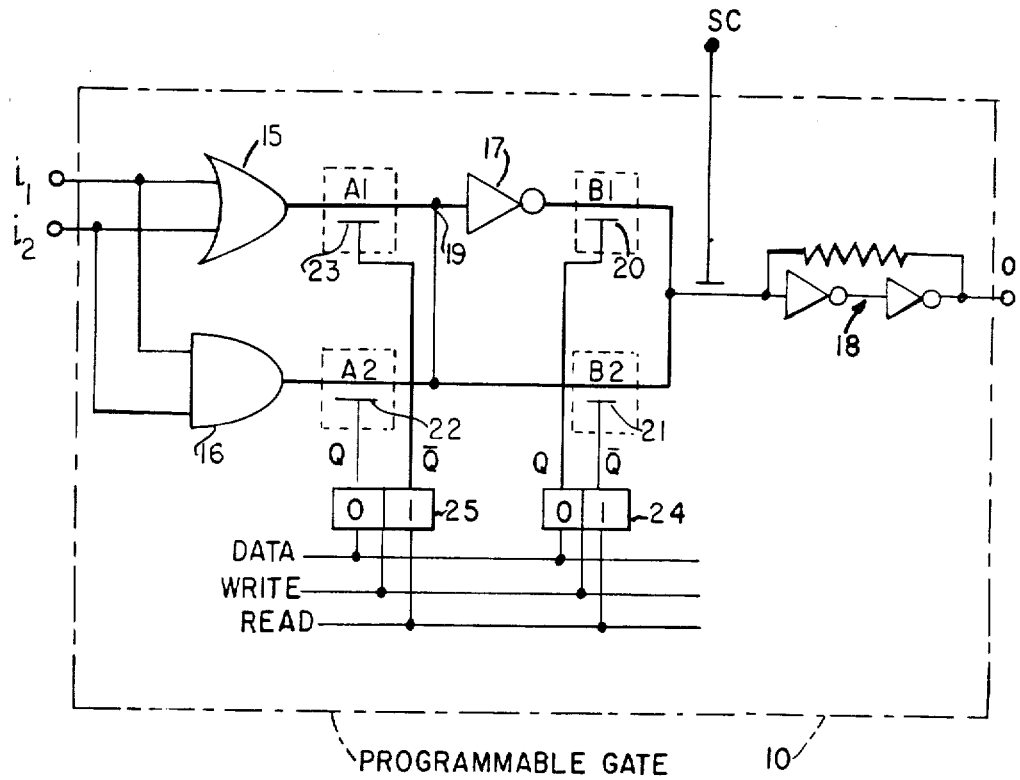
FIG. 1 is a schematic block diagram of a programmable hardware gate in accordance with the present invention.

Referring now to the drawings, reference numeral 10 designates a programmable hardware gate according to the present invention which corresponds to and emulates a logic element in a logic circuit whose design is to be evaluated. Before further describing gate 10, reference is made to FIG. 8 which shows circuit 100 comprising an array of logic elements 11, 12, 13, and 14 connected together for the purposes of illustrating a logic circuit whose design is to be verified. The array of logic elements shown in FIG. 8 has been selected for illustration purposes only.

Figure 8:
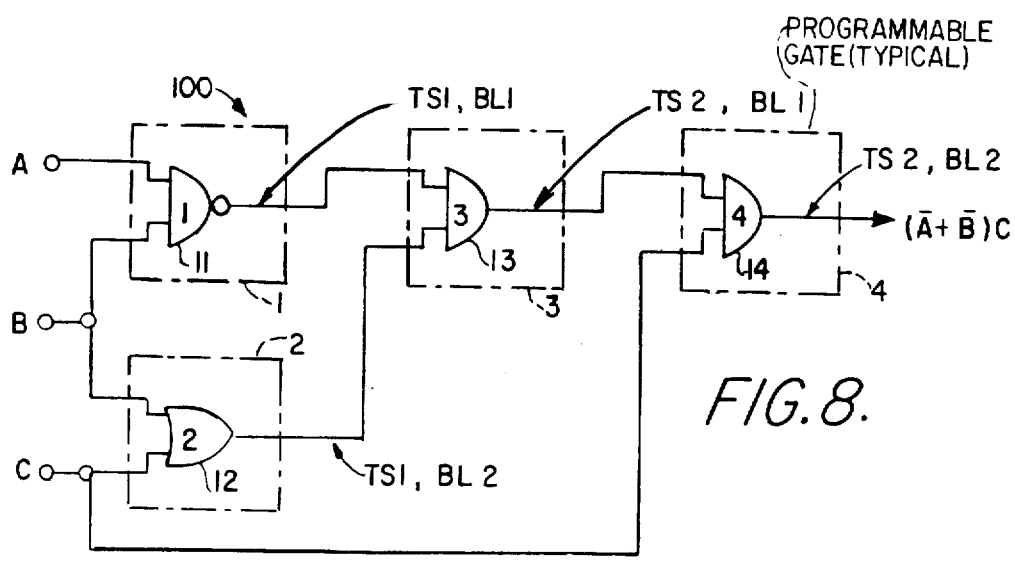
FIG. 8 is a fragment of a simple logic circuit for illustrating the multiplexing operation of the present invention.

In the circuit shown in FIG. 8, element 11 is a NAND gate, element 12 is an OR gate, and elements 13 and 14 are AND gates. Circuit 100 is amenable to an analytical determination of its transfer function: (A+B)C for the inputs A,B,C. The present invention will be described using circuit 100 as an example. Circuit 100 can be evaluated, in a non-analytical fashion, by applying the eight possible combinations of 0,1's to the three inputs A,B,C, and evaluating the output of gate 14 to verify that in fact, one obtains the output indicated for each of such combinations. For example, for an input 0,0,1 at the terminals A,B,C, the output of gate 14 should be 1, etc.

The present invention operates to evaluate logic circuits many times more complex than illustrated in FIG. 8 using the principle of first emulating the logic circuits, using programmable gates like that shown in FIG. 1, and then applying all possible inputs to determine each output response. The present invention thus provides a programmable hardware gate 10 for each gate in the actual circuit, and connects gate 10 to other programmable gates in a particular hierarchy, illustrated in FIG. 2, which will be described after explaining how gate 10 is made to correspond to and emulate a logic element in the logic circuit to be evaluated.

Gate 10 is provided with two inputs: $i_1$, $i_2$ and a single output o. Contained in gate 10 is OR gate 15, AND gate 16, inverter 17, latch 18, and four electronic switches A1, A2, B1, B2. The inputs $i_1$ and $i_2$ of gate 10 are applied in parallel to gates 15 and 16 whose outputs are connected at node 19 through electronic switches A1, A2. Node 19 is at the input of inverter 17 whose output is applied to latch 18 through electronic switch B1 in parallel with a shunt from node 19 formed by switch B2.

The state of each electronic switches A1, A2, B1, B2 is established by the nature of the logic element that the gate emulates. For example, to emulate gate 11 shown in FIG. 8, electronic switches A1 and B2 would be open and switches A2 and B1 would be closed. In order to emulate logic element 12 shown in FIG. 8, switches A2 and B1 would be open and switches A1 and B2 would be closed.

The electronic switches in a programmable gate are established by using pass transistors 20, 21, 22, 23. Switch B1 will be in a closed state while pass transistor 20 conducts, and will be an open state when this transistor is nonconductive. Conduction of the pass transistors in programmable gate 10 is controlled by flip-flops: flip-flop 24 controls the state of switches B1 and B2, and flip-flop 25 controls the state of switches A1 and A2. By reason of the design of programmable gate 10, switches A1 and A2 are never both open or both closed simultaneously; and the same is true with respect to switches B1 and B2. As a consequence, only a single flip-flop is needed for controlling the states of a pairs of switches. Thus, in order to simulate the gate 11 in FIG. 8, output Q of flip-flop 25 would be high and output Q of flip-flop 24 would be high.

The states of flip-flops 24, 25 are controlled in a conventional way utilizing data, write and read signals supplied to the flip-flops from a central control (not shown). Having thus established a programmable gate for each logic element in the logic circuit to be evaluated by following the procedure described above, the interconnections between the logic elements in the actual logic circuits are emulated in the manner illustrated in FIGS. 2-5.

Referring now to FIG. 2, module 30, comprising four programmable gates, constitutes a level 0 module. The number of gates is selected for illustration purposes only, the preferred arrangement being 128 programmable gates in a level 0 module. By appropriately setting switches A1, A2, B1, B2 in each of the gates, programmable gate 1 is configured to emulate gate 11 in FIG. 8, gate 2 is configured to emulate logic element 12 in FIG. 8, and gate 4 is configured to emulate logic element 14 in FIG. 8. Additional logic elements that are a part of a logic circuit being evaluated are emulated by level 0 module 32 shown in FIG. 2, etc.

Level 0 module 30 also includes a level 0 output bus 33 and an input level 0 bus 34, each of these buses comprising a plurality of bus lines, in this case two. In general, more than two bus lines would be involved in each of the level 0 buses.

Associated with each programmable gate is output distributor 35 for establishing selective connections between the output o of the programmable gate and either of output bus lines L1, L2 of level 0 output bus 33. Also associated with each programmable gate is input selector 36 for establishing selective connections between inputs $i_1$ and $i_2$ of a programmable gate and input bus lines L1, L2 of level 0 input bus 34. Finally, level 0 module 30 also includes input/output (I/O) buffer 37 for selectively connecting bus lines L1, L2 of level 0 output bus 33 to corresponding bus lines L1, L2 of level 0 input bus 34.

Output distributors 35 and input selectors 36 of a given level 0 module constitute interconnections that are selectively operable for establishing a connection between the output of any programmable gate and an input to any programmable gate. In a manner to be described below, multiplex means are provided for operating the interconnection means and determining which, and when, each connection is made between bus lines, on the one hand, and the respective inputs and the output, on the other hand, of any hardware programmable gate.

Details of input selector 36 are shown in FIG. 3 to which reference is now made. Essentially, selector 36 is designed to select which bus line of level 0 bus line 34 is to be connected to which of the two inputs to a programmable gate, and to determine when such connection is to be effected. Line L1 of bus 34 is connected to input $i_1$ when the state of selector flip-flop 37 causes pass transistor 38 to conduct; and line L2 of bus 34 is connected to input $i_1$ of a programmable gate when the state of selector flip-flop 39 causes pass transistor 40 to conduct. In a similar manner, flip-flops 41 and 42 control the selective connection of lines L1 and L2 of bus 34 to input $i_2$ of a programmable gate. The state of flip-flops 37, 39, 41, and 42 are controlled from a central control (not shown) according to a predetermined schedule explained below.

The time period during which bus lines L1, L2 are connected to inputs $i_1$, $i_2$ of a programmable gate is established by signals developed by time slot counter 43 whose output is accessible to the entire apparatus. Thus, time slot counter 43 produces, in a repetitive manner, all the possible combinations of highs and lows on lines 44 to which comparators 45, 45A are connected. Each particular input selector is provided with an identification code contained in respective registers 46, 46A specifying the time slot during which connections determined by the state of flip-flops 37, 39, 41, and 42 are effected. The numbers stored in registers 46, 46A are set by a central control unit (not shown) as part of setting up the apparatus as described.

In operation, comparators 45, 45A decode the output of time slot counter 43 and produce, during the appropriate time slots, outputs that are effective to turn on pass transistors 47, 48 within such time slot. Transistors 47, 48 are individually associated with input lines $i_1$, $i_2$ of a programmable gate, and conduction of these transistors temporally limits the connection of the bus lines to the inputs to a programmable gate as determined by the states of selection flip-flops 37, 39, 41, 42.

The inputs to a programmable gate may also be external to the bus line; and to this end, data via lines 52 can be applied to the inputs using circuit 52A, 52B. In such case, control information that determines when external settings for the inputs are to be applied is supplied by WRITE lines 51 under central control (not shown). Further discussion of the operation of selector 36 will be deferred until output distributor 35 and I/O buffer 37 are described.

Figure 4:
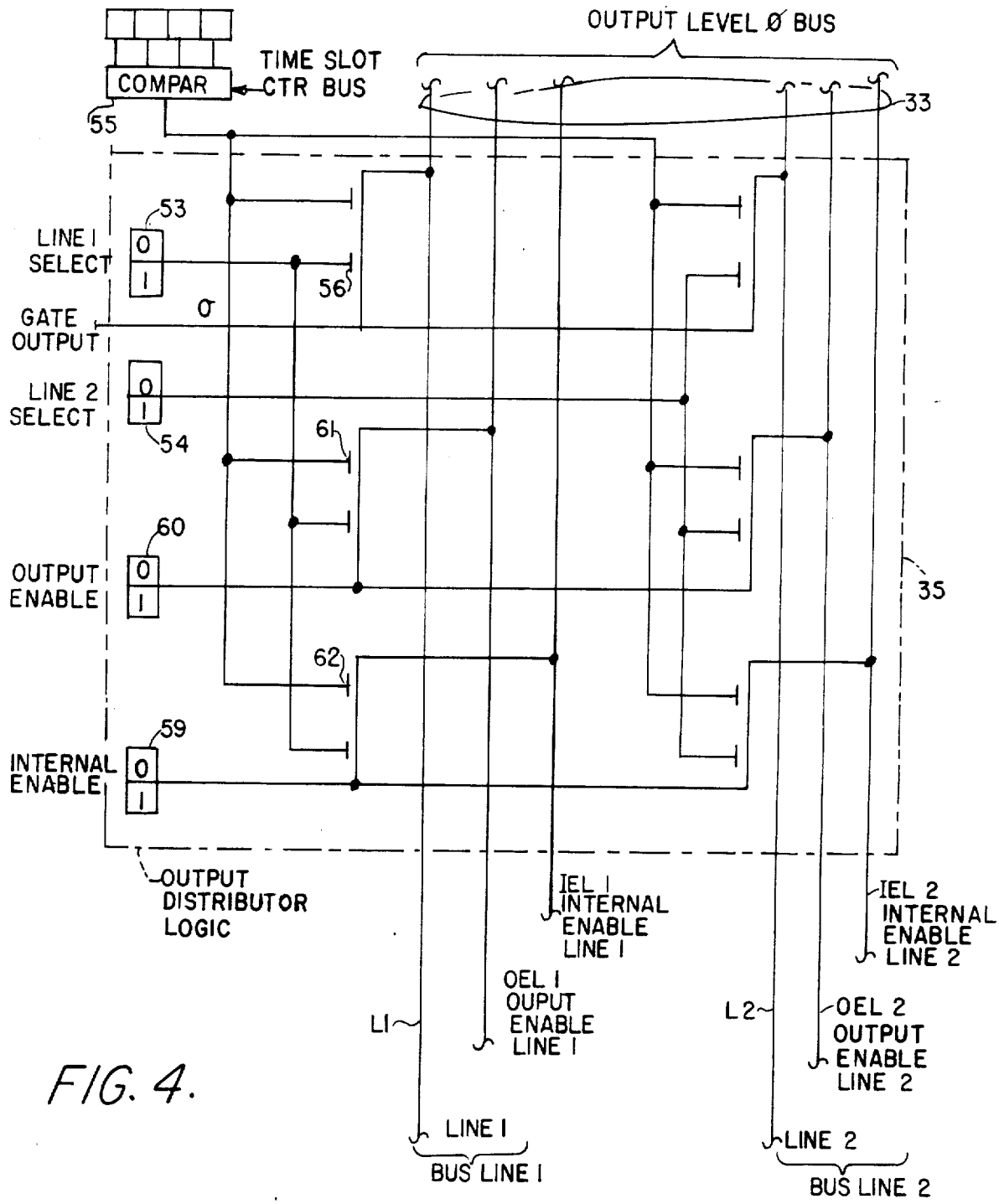
FIG. 4 is a schematic block diagram of an output distributor for selectively connecting the output of a programmable gate in a level 0 module to individual bus lines of a level 0 output bus.

As shown in FIG. 4, level 0 output bus 33 comprises output bus lines L1 and L2 and in addition, a pair of enable lines associated with each bus line. The connection of output line o of a programmable gate to bus line L1 or bus line L2 is controlled, in part, by line select flip-flops 53, 54 and, in part, by the output of comparator 55 which is similar in operation to compartor 45 of input selector 36. Thus, if the state of flip-flop 53 is such that pass transistor 56 conducts, output line o will be connected to bus line L1 during a time interval determined by comparator 55 which produces an output that will cause pass transistor 57 to conduct in accordance with the code set in register 58. Similarly, output line o of a gate will be connected to bus line L2 of level 0 output bus 33 depending upon the state of flip-flop 54 and the output of comparator 55.

As indicated previously, and as shown in FIG. 4, internal enable line IEL-1 and output enable line OEL-1 are associated with bus line L1. As explained below, these two enable lines respectively control the internal transfer of information from the outputs of programmable gates in a level 0 module to the inputs thereof, and control the transfer of information from the outputs of gates in one level 0 module to gates in another level 0 module as explained below.

Just as connections of the bus lines in the input and output buses to the inputs to, and the output from, a programmable gate involve a decision as to which, and when, such connections are made, so it is with the enable lines associated with each output bus line. The decision as to "which" is determined by the setting of flip-flops 59 and 60, and line select flip-flops 53, 54, whose states are determined by a central control (not shown); and the "when" is determined by the output of comparator 55 which controls the conduction of pass transistors 61, 62. Thus, internal enable line IEL 1 is placed in a high condition during a given time slot by setting line-select flip-flop 53 and internal-enable flip-flop 59, and the conduction of pass transistor 62 which is controlled by the output of comparator 55. In a similar manner, output enable line OEL-1 is placed in a high condition during a given time slot by the setting of line-select flip-flop 53 and output-enable flip-flop 60, and the conduction of pass transistor 61. Enable lines IEL-2, OEL-2 are placed in a high condition during a given time slot in a similar manner.

As explained above, I/O buffer 37 is provided for the purpose of interconnecting bus lines in level 0 output bus 33 with corresponding bus lines in level 0 input bus 34. Additionally, I/O buffer 37 also permits the transfer of information between one level 0 module and another level 0 module via level 1 connecting bus 70. That is to say, individual bus lines of a level 0 output bus associated with a given level 0 module can be connected to the bus lines of a level 0 output bus associated with another level 0 module by the programming of I/O buffer 37. Specifically, the output enable lines associated with respective bus lines in a given level 0 output bus are used for the purpose of controlling the transfer of information from one level 0 module to another level 0 module and the transfer of information from another level 0 module to the first-mentioned level 0 module.

Figures 5, 5A:
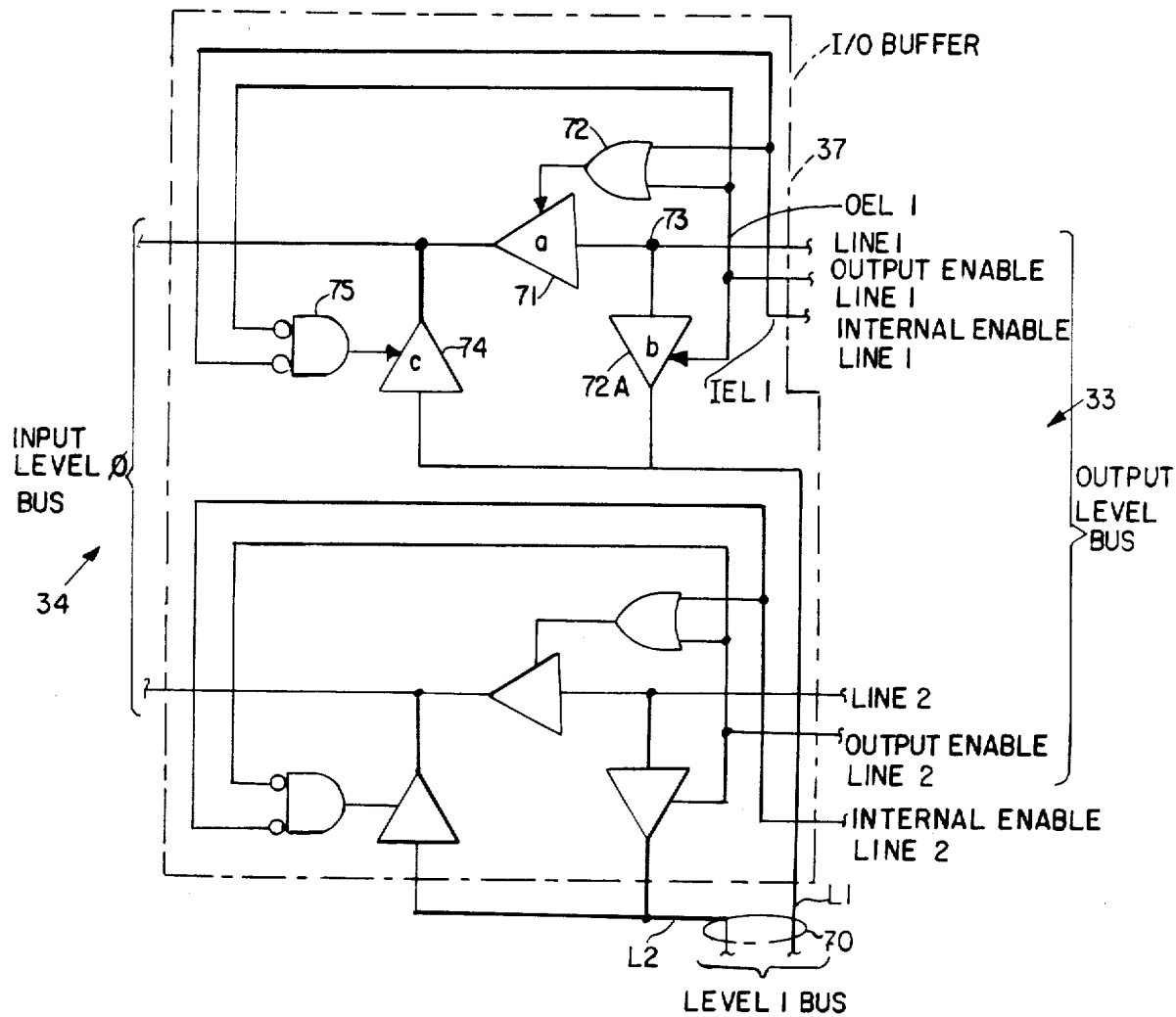
FIG. 5 is a schematic block diagram of an I/O buffer for interconnecting a level 0 output bus to a level 0 input bus associated with a level 0 module.
FIG. 5a is a chart for illustrating the possible connections effected by an I/O buffer such as shown in FIG. 5.

Referring now to FIG. 5, each line in output bus 33 is connected to a corresponding line in input bus 34 through gated amplifier 71 whose conductive state is determined by the output of OR gate 72. Whenever IEL-1 (internal enable line 1) is in a high condition, gate 72 has an output; and this causes amplifier 71 to conduct connecting line L1 of bus 33 to line L1 of bus 34. This condition of IEL-1 thus permits the output of any programmable gate in a level 0 module to be connected to any input of any of the programmable gates of the same module via a single bus line.

I/O buffer 37 also contains gated amplifier 72A which connects node 73 at the input of gated amplifier 71 to line L1 of level 1 bus 70. Conduction of gated amplifier 72A is controlled by output enable line L1 such that when the latter is in a high condition, amplifier 72A conducts and information in line L1 of bus 33 is transferred to a corresponding line in level 1 bus 70. As shown in FIG. 2, level 1 bus 70 provides a communication path between level 0 module 30 and level 0 module 32 (FIG. 2). Information from module 30 is sent to module 32 via bus 70 by placing the output enable lines in output level bus 33 in a high state.

Information from module 32 can be transferred to module 30 via bus 70 by reason of gated amplifier 74 connected across the outputs of gated amplifier 71 and 72A as shown in FIG. 5. The conduction of gated amplifier 74 is controlled by gate 75 to the inputs of which are applied signals from OEL-1 and IEL-1. These signals are inverted before being ANDed by gate 75 such that amplifier 74 conducts only when neither OEL-1 nor IEL-1 is in a high condition. Reference should be made to FIG. 5A which is a chart that summarizes the connections effected by the gated amplifiers in FIG. 5.

The architecture of the apparatus according to the present invention is illustrated in FIG. 6 which shows how the multi-level hierarchy referred to above is constructed. Thus, FIG. 6 shows the two previously described level 0 modules 30 and 32 as part of a larger number of level 0 modules connected together by level 1 bus 70 into level 1 module 76. Other level 0 modules are connected together in the same manner to form other level 1 modules. Different level 1 modules are connected together by bus interfaces one of which is designated by reference numeral 77 in FIG. 7. Thus, communication between level 1 module 76 and level 1 module 78 takes place via level 2 bus 79 under the control of bus interfaces 77 and 80.

To control the flow of information in level 2 bus 79, bus interface 77 comprises a pair of oppositely poled gated amplifiers 81 and 82 connected across level 1 bus 70 and level 2 bus 79. Conduction of amplifiers 81 and 82 is controlled by the output of random access memory (RAM) 83 which provides gate signals to each of the amplifiers in accordance with the output of time slot counter 43. That is to say, random access memory 83 is programmed as a lookup table so that upon the occurrence of predetermined inputs from time slot counter 43 to memory 83, the conduction of amplifiers 81 and 82 is selectively established.

In a preferred embodiment of the invention, three additional hierarchical levels are provided making a total of five levels. Bus interfaces, like that shown at 77 and 80 are used to interconnect several level 2 buses to a level 3 bus. Similarly, bus interfaces interconnect several level 3 buses to a level 4 bus, etc.

Figure 9:
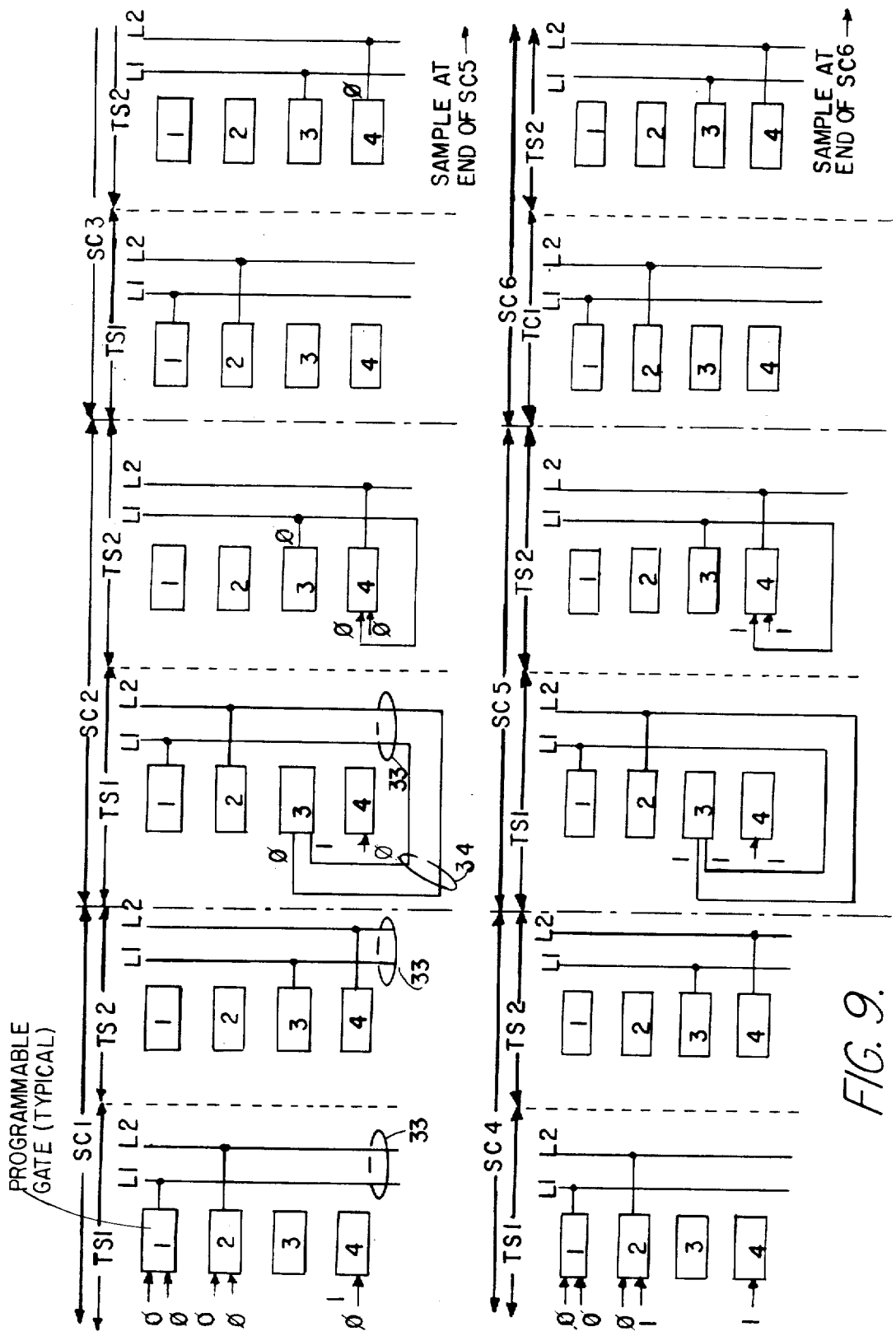
FIG. 9 is a composite drawing showing the interconnections between the various components of a module making up the circuit shown in FIG. 8 for the purpose of illustrating the interconnections effected by the present invention in terms of the input and output level 0 buses as a function of the simulation cycle and the time slot.

The time division multiplex carried out in accordance with the present invention is illustrated in FIGS. 8 and 9 to which reference is now made. Only two time slots are necessary for the simple circuit shown in FIG. 8 but this circuit will facilitate an understanding of time multiplexing that is used in more complex circuits. Logic circuit 100 shown in FIG. 8 is achieved by four programmable gates such as the four gates shown in FIG. 2. Programmable gate 1 is configured as a NAND gate in the manner previously described in connection with FIG. 1, etc. The inputs at A, B, and C are effected by suitable operation of input flip-flops 37, 39, 41, 42 of the input selectors associated with each programmable gate. In order to apply all of the possible inputs to logic circuit 100 and determine all of the possible outputs, twenty-four simulation cycles are required as indicated in the chart of FIG. 8A.

During the first time slot in each simulation cycle, the outputs of gates 1 and 2 are connected to respective lines L1 and L2, but the outputs of gates 3 and 4 are open. However, during the second time slot of a simulation cycle, the reverse situation obtains in that only the outputs of gates 3 and 4 are connected respectively to lines L1 and L2. During simulation cycle 1, the inputs at A, B, C are 0,0,0 necessitating the application of 0's to the inputs of each of programmable gates 1 and 2 as shown in FIG. 9. These inputs are effected by the application of high levels to DATA lines 52 and information in WRITE lines 51 in each of the input selectors associated with programmable gates 1 and 2.

During time slot 1, output distributor 35 associated with each of programmable gates 1 and 2 is operated so that the output of programmable gate 1 is connected to line 1 of output bus 33 and the output of programmable gate 2 is connected to line 2 of output bus 33 as indicated in FIG. 9. Because programmable gate 1 is a NAND gate, the output of this gate is high and bus line 1 is thus high. Programmble gate 2 is an OR gate; and because each input to this gate is a 0 the output is also low as shown in the first line of the chart of FIG. 8A. During time slot 2, in simulation cycle 1, the output of programmable gate 3 is connected to line 1 of output bus 33 and the output of programmable gate 4 is connected to line 2 of output bus 33. During time slot 1 of the second simulation cycle, the signal has propagated through the gates with the result that during the first time slot in the second simulation cycle the output of gate 1 is high and the output of gate 2 is low, and these outputs are carried to lines 1 and 2 of the output bus 33.

During time slot 1 of the second simulation cycle, however, IO buffer 37 is configured such that line 1 of the output bus is connected to line 1 of the input bus and line 2 of the output bus is connected to line 2 of the input bus. As described previously, this is effected by causing the internal enable lines associated with each of the lines in the output bus to be in a high condition. The result is that outputs of programmable gate 1 is applied to one input of programmable gate 3, and the output of programmable gate 2 is applied to the other input of programmable gate 3, again by proper application of control signals to the input selector associated with programmable gate 3. In time slot 2, the connection of the programmable gate with the output bus is switched again so that the output of programmable gate 3 is connected to output line L1 and the output of programmable gate 4 is connected to line 2 of the output bus. During time slot 2 of the second simulation cycle, the input to programmable gate 4 is forced to 0,0 because programmable gate 3 is a NAND gate and its input is 0,1.

During time slot 1 of simulation cycle 3, programmable gates 1 and 2 are again connected to the output lines, and produce, once more, 1 and 0 respectively. During time slot 2 of the third simulation cycle, however, when gates 3 and 4 are again connected to lines L1 and L2 of the output bus, the output of AND gate 4, is a 0; and sampling of output of this gate at the end of the third simulation cycle provides a 0 which confirms the 0,0,0, input originally applied to the input.

The procedure described above is repeated and the next three simulation cycles are illustrated schematically in FIG. 9. At the end of the sixth simulation cycle the output of gate 4 is again sampled and at this time the value is 1 which is correct for the transfer function shown in FIG. 8. By sampling the output of gate 4 after every third simulation cycle, all possible outputs for all possible inputs will be obtained.

The present invention can be used for purposes other than simulation hardware for another system. For example, it can be used as a programmable general purpose instrument. In such case, a real-time controller can be constructed in a form of a general purpose instrument built in the manner described above and programmed to do the desired real-time control.

The present invention is also applicable to an event driven logic simulator in which only those gates that have a state-change in the input are evaluated. Such a simulator can be achieved using the present invention by dynamically assigning time slots. Each programmable gate which has a change is assigned a time slot, for just one simulation cycle, to transmit the value of the signal. One way to implement this modification is to provide for the transmitting gate to transmit both the code of the signals along with its value, and all inputs which are connected to the output will detect the transmission and sample the signals.

Finally, the present invention can handle simulations where the basic element is not a gate, and the signals have more than two states. For example, circuit simulation can be done if a coded number or an analog value is transmitted between the elements of the present invention. In such case, the elements will be either digital or analog computing elements rather than gates. Also, logic simulations, where signals can take several logic states can be done by having more than one bit for each interconnect signal.

From the foregoing description, one skilled in the art can easily ascertain the essential characteristics of the present invention, and, without departing from the spirit and scope thereof, can make various changes and modifications of the invention to adapt it to various usages and conditions.

What is claimed is:

1. Apparatus for verifying the design of a logic circuit composed of a plurality of interconnected logic elements comprising:
    (a) a plurality of harware gates, each of which corresponds to and emulates a logic element in said circuit, each hardware gate having an output and at least two inputs;
    (b) interconnnection means selectively operable for establishing a connection between the output of a given hardware gate and an input of any other hardware gate including said given gate; and
    (c) multiplex means for operating said interconnection means and determining which, and when, each connection is made.

2. Apparatus according to claim 1 wherein each hardware gate is programmable for emulating an AND gate, an OR gate, a NAND gate, or a NOR gate.

3. Apparatus according to claim 1 wherein each hardware gate comprises a plurality of logic gates interconnected by switches whose setting configures the hardware gate to emulate a logic element in said logic circuit.

4. Apparatus according to claim 3 including means for selectively setting said switches.

5. Apparatus according to claim 3 wherein each hardware gate comprises an AND gate, an OR gate, an inverter, and electronic switches for effecting interconnections between the various gates.

6. Apparatus according to claim 5 including means to operate said switches for programming each hardware gate to emulate a logic element.

7. Apparatus according to claim 6 including means to latch the output of each hardware gate.

8. Apparatus according to claim 1 wherein said multiplex means establishes the output to, and input of, the apparatus and is constructed and arranged to establish temporarily limited connections between said hardware gates according to a schedule upon the completion of which the apparatus will have produced outputs corresponding to the output of said logic circuit for each possible input thereto.

9. Apparatus according to claim 8 wherein said multiplex means includes a time slot counter for producing time slot signals that establish a plurality of time slots within which said temporally limited connections are made.

10. Apparatus according to claim 9 wherein said interconnection means includes an input selector associated with the inputs of each hardware gate, and an input bus having a plurality of input bus lines, said input selector being constructed and arranged for selectively connecting the input of a hardware gate to, or selectively disconnecting the input from, any one of said input bus lines of said input bus.

11. Apparatus for verifying the design of a logic circuit composed of a plurality of interconnected logic elements comprising:
  (a) a plurality of hardware gates, each of which corresponds to and emulates a logic element in said circuit, each hardware gate having an output and at least two inputs;
  (b) interconnection means selectively operable for establishing a connection between the output of any hardware gate and the input of any hardware gate; and
  (c) multiplex means for operating said interconnection means and determining which, and when, each interconnection is made;
  (d) said multiplex means establishing the output to, and the input of the apparatus, said multiplex means being constructed and arranged to establish temporarily limited connections between said hardware gates according to a schedule upon the completion of which the apparatus will have produced outputs corresponding to the output of said logic circuit for each possible input thereto;
  (e) said multiplex means including as time slot counter for producing time slot signals that establish a plurality of time slots within which said temporally limited connections are made;
  (f) said interconnection means including an input selector associated with the inputs of each hardware gate, and an input bus having a plurality of input bus lines, said input selector being constructed and arranged for selectively connecting the input of a hardware gate to, or selectively disconnecting the input from, any one of said input bus lines of said input bus; and
  (g) wherein the number of input lines is equal to the number of output lines.

12. Apparatus for verifying the design of a logic circuit composed of a plurality of interconnected logic elements comprising:
  (a) a plurality of hardware gates, each of which corresponds to and emulates a logic element in said circuit, each hardware gate having an output and at least two inputs;
  (b) interconnection means selectively operable for establishing a connection between the output of any hardware gate and the input of any hardware gate; and
  (c) multiplex means for operating said interconnection means and determining which, and when, each interconnection is made;
  (d) said multiplex means establishing the output to, and the input of the apparatus, said multiplex means being constructed and arranged to establish temporarily limited connections between said hardware gates according to a schedule upon the completion of which the apparatus will have produced outputs corresponding to the output of said logic circuit for each possible input thereto;
  (e) said multiplex means including as time slot counter for producing time slot signals that establish a plurality of time slots within which said temporally limited connections are made;
  (f) said interconnection means including an input selector associated with the inputs of each hardware gate, and an input bus having a plurality of input bus lines, said input selector being constructed and arranged for selectively connecting the input of a hardware gate to, or selectively disconnecting the input from, any one of said input bus lines of said input bus; and
  (g) wherein said input selector includes, for each input to a hardware gate, selectively operable means by which such input can be connected to or disconnected from an input bus line.

13. Apparatus according to claim 12 wherein said selectively operable means includes a first circuit that controls which input bus line is to be connected to and input to a hardware gate, and a second circuit that controls when, and for how long, an input bus line is to be connected to a hardware gate.

14. Apparatus according to claim 13 wherein each of said first and second circuits includes a pass transistor.

15. Apparatus according to claim 14 wherein said input selector includes a comparator/decoder for producing a signal upon the occurrence of a preselected time slot, said second circuit being responsive to a signal to produce by said comparator/decoder for connecting an input bus line to an input of a hardware gate during a preselected time slot.

16. Apparatus for verifying the design of a logic circuit composed of a plurality of interconnected logic elements comprising:
  (a) a plurality of hardware gates, each of which corresponds to and emulates a logic element in said circuit, each hardware gate having an output and at least two inputs;
  (b) interconnection means selectively operable for establishing a connection between the output of any hardware gate and the input of any hardware gate; and
  (c) multiplex means for operating said interconnection means and determining which, and when, each interconnection is made;
  (d) said multiplex means establishing the output to, and the input of the apparatus, said multiplex means being constructed and arranged to establish temporarily limited connections between said hardware gates according to a schedule upon the completion of which the apparatus will have produced outputs corresponding to the output of said logic circuit for each possible input thereto;
  (e) said multiplex means including as time slot counter for producing time slot signals that establish a plurality of time slots within which said temporally limited connections are made; and (f) wherein said interconnection means includes an output distributor associated with with the output of each hardware gate, and an output bus having a plurality of output lines, said output distributor being constructed an arranged for selectively connecting the output of a hardware gate to, or selectively disconnecting the output from, any one of said lines of said output bus.

17. Apparatus according to claim 16 wherein said output distributor includes, for each output from a hardware gate, selectively operable means by which each output can be connected to, or disconnected from, an output bus line.

18. Apparatus according to claim 17 wherein said selectively operable means includes a first circuit that controls which output bus lines is to be connected to an output line from a hardware gate, and a second circuit that controls when, and for how long, an output bus line is to be connected to an output from a hardware gate.

19. Apparatus according to claim 18 wherein each of said first and second circuits includes a pass transistor.

20. Apparatus according to claim 18 wherein said output distributor includes a comparator/decoder for producing a signal upon the occurrence of a preselected time slot, said second circuit being responsive to a signal produced by said comparator/decoder for connecting an output bus line to an output line of a hardware gate during a preselected time slot.

21. Apparatus according to claim 16 wherein an internal enable line and an internal enable circuit for operating the same are associated with each output bus line, said internal enable circuit being selectively operable for establishing the state of said internal enable line.

22. Apparatus according to claim 16 wherein said output bus includes, for each output bus line, an external enable line and an external enable circuit selectively operable for establishing the state of said external enable line.

23. Apparatus according to claim 22 wherein an internal enable line and an internal enable circuit for operating the same are associated with each output bus line, said internal enable circuit being selectively operable for establishing the state of said internal enable line.

24. Apparatus according to claim 23 wherein said selectively operable means includes a first circuit that controls which output bus line is to be connected to an output line from a hardware gate, and a second circuit that controls when, and for how long, an output bus line is to be connected to an output from a hardware gate.

25. Apparatus according to claim 24 wherein said output distributor includes a comparator/decoder for producing a signal upon the occurrence of a preselected time slot, said second circuit being responsive to a signal produced by said comparator/decoder for connecting an output bus line to an output line of a hardware gate during a preselected time slot.

26. Apparatus according to claim 23 wherein said interconnection means includes an input selector associated with the inputs of each hardware gate, and an input bus having a plurality of input bus lines, said input selector being constructed and arranged for selectively connecting the input of a hardware gate to, or selectively disconnecting the input from, any one of said input bus lines of said input bus.

27. Apparatus according to claim 26 wherein said interconnection means includes an input/output (I/O) buffer interposed between said input and output bus lines for selectively connecting an output bus line to a corresponding input bus line.

28. Apparatus according to claim 27 wherein said I/O buffer includes means responsive to the state of an internal enable line associated with a given output bus lines for connecting the latter to the corresponding input bus line.

29. Apparatus according to claim 28 wherein said means responsive to the state of an internal enable line includes a first gated amplifier connecting said given output bus line to its corresponding input bus line, the conduction of said first gated amplifier being controlled by the output of an OR-gate to which said internal enable line is connected.

30. Apparatus according to claim 29 wherein said I/O buffer includes an external bus line associated with corresponding output and input bus lines, and means responsive to the state of an external enable line associated with a given output bus line for connecting the latter to its associated external bus line.

31. Apparatus according to claim 30 wherein said means responsive to the state of an external enable line includes a second gated amplifier connecting an external bus line to its associated output bus line, the conduction of said second gated amplifier being controlled by the state of the external enable line associated with the last mentioned output bus line.

32. Apparatus according to claim 31 wherein the output enable line associated with a given output bus line provides an input to the OR-gate whose output controls the first gated amplifier which said given output line is connected to a corresponding input bus line.

33. Apparatus according to claim 31 wherein a third gated amplifier is connected between the outputs of the first and second gated amplifiers for establishing a connection between an external bus line and the input bus line associated therewith when said third gated amplifier conducts, and a logic element for controlling conduction of said third gated amplifier in response to the state of both the output and internal enable lines associated with the output bus line with which the last mentioned input bus line is associated.

34. Apparatus for verifying the design of a logic circuit composed of a plurality of interconnected logic elements comprising:
(a) a plurality of level 0 modules each of which comprises a plurality of hardware gates having inputs and outputs and individually corresponding to and emulating different logic elements of said logic circuit;
(b) a level 0 output bus having a plurality of output bus lines that correspond to a plurality of input bus lines of a level 0 input bus;
(c) an output distributor associated with each hardware gate for establishing connections between the outputs of the hardware gates and the output bus line of the level 0 output bus;
(d) an input selector associated with each hardware gate for establishing connections between inputs to the hardware gates and the input bus lines of the level 0 input bus; and
(e) an input/output buffer for selectively connecting output bus lines of a level 0 output bus to corresponding input bus lines of the level 0 input bus.

35. Apparatus according to claim 34 including a level 1 bus for interconnecting the input/output buffers of pairs of level 0 modules.

36. Apparatus according to claim 35 including a bus interface connected to each level 1 bus, and a level 2 bus for interconnecting pairs of bus interfaces.

37. Apparatus according to claim 34 including a level 3 bus, and a bus interface connected between a level 2 bus and the level 3 bus.

38. Apparatus according to claim 37 including a level 4 bus, and a bus interface connected between the level 3 bus and the level 4 bus.

39. Apparatus according to claim 38 including a level 5 bus, and a bus interface connected between the level 4 bus and the level 5 bus.

* * * * *

UNITED STATES PATENT AND TRADEMARK OFFICE
CERTIFICATE OF CORRECTION

PATENT NO. : 4,697,241

DATED : September 29, 1987

INVENTOR(S) : Yoav LAVI

It is certified that error appears in the above-identified patent and that said Letters Patent is hereby corrected as shown below:

At column 1, line 55, delete "," after "processors".

At column 3, line 22, change "require" to ---requires---.

At column 5, line 3, insert ---of--- after "each".

At column 5, line 23, change "pairs" to ---pair---.

At column 5, line 44, insert ---gate 3 is configured to emulate logic element 13 in FIg. 8,--- before "and".

At column 6, line 62, change "compartor" to ---comparator---.

At column 8, line 43, insert ---,--- after "provided".

At column 8, line 45, insert ---,--- after "80".

At column 8, lines 48-50, change "The time division multiplex carried out in accordance with the present invention is illustrated in FIgs. 8 and 9 to which reference is now made." to ---Reference is now made to the time division multiplex carried out in accordance with the present invention, illustrated in Figs. 8 and 9.---.

At column 8, line 51, insert ---,--- after "8".

At column 8, line 54, insert ---,--- after "100" and after "8".

At column 9, line 1, change "obtains" to ---is obtained---.

UNITED STATES PATENT AND TRADEMARK OFFICE
CERTIFICATE OF CORRECTION

PATENT NO. : 4,697,241

DATED : September 29, 1987

INVENTOR(S) : Yoav LAVI

It is certified that error appears in the above-identified patent and that said Letters Patent is hereby corrected as shown below:

At column 11, lines 37-38, change "temporarily" to ---temporally---.
    At column 11, line 43, change "as" to ---a---.
    At column 12, line 12, change "as" to ---a---.
    At column 12, line 65, change "as" to ---a---.
    At column 13, line 2, delete "with" (second occurrence).
    At column 13, line 5, change "an" to ---and---.
    At column 14, line 5, change "lines" to ---line---.

Signed and Sealed this

Thirtieth Day of May, 1989

*Attest:*

DONALD J. QUIGG

*Attesting Officer*

*Commissioner of Patents and Trademarks*